United States Patent
Gluche et al.

(10) Patent No.: US 7,393,717 B2
(45) Date of Patent: Jul. 1, 2008

(54) DIAMOND-BASED ELECTRICAL RESISTOR COMPONENT

(75) Inventors: Peter Gluche, Ulm (DE); Stephan Ertl, Trossigen (DE); Dirk Grobe, München (DE)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 115 days.

(21) Appl. No.: 10/513,864

(22) PCT Filed: May 7, 2003

(86) PCT No.: PCT/EP03/04792

§ 371 (c)(1), (2), (4) Date: Dec. 7, 2004

(87) PCT Pub. No.: WO03/096357

PCT Pub. Date: Nov. 20, 2003

(65) Prior Publication Data

US 2005/0224806 A1 Oct. 13, 2005

(30) Foreign Application Priority Data

May 7, 2002 (DE) ................. 102 20 360

(51) Int. Cl.
*H01L 31/0312* (2006.01)

(52) U.S. Cl. ............... 438/105; 438/50; 438/125

(58) Field of Classification Search ............. 257/532, 257/537, 535, 536, 538, 77, 78, 79, 81, 76, 257/621, E29.082, E21.046, E21.004, E21.005; 438/21, 50, 54, 105, 113, 125, 584, 680; 606/28, 41; 347/56, 63, 64

See application file for complete search history.

(56) References Cited

U.S. PATENT DOCUMENTS

| 5,348,909 A | 9/1994 | Stasiak |
| 6,614,095 B1 * | 9/2003 | Adamschik et al. ......... 257/621 |
| 2002/0044174 A1 | 4/2002 | Hofer et al. |
| 2003/0109867 A1 * | 6/2003 | Gluche et al. ................. 606/41 |

FOREIGN PATENT DOCUMENTS

WO 99/63596 12/1999

OTHER PUBLICATIONS

M. Werner et al., "Thermistor based on doped polycrystalline diamond thin films," Diamond and Related Materials, 1 (1992), Elsevier Science Publishers, B.V., Amsterdam, pp. 669-672.

W. Hanni et al., "Selective area deposition of diamond on 4 in Si wafers," Thin Solid Films, 236 (1993), Elsevier Sequoia, Lausanne, Switzerland, pp. 87-90.

* cited by examiner

*Primary Examiner*—Thomas L. Dickey
*Assistant Examiner*—Fazli Erdem
(74) *Attorney, Agent, or Firm*—Lowe Hauptman Ham & Berner LLP

(57) ABSTRACT

The invention relates to an electrical component having a resistance area and contacts electrically connected to the resistance area, the resistance area including electrically conductive diamond. The resistance area can be configured as a resistance layer on top of a substrate while the substrate can be made at least in part of electrically non-conducting diamond.

26 Claims, 1 Drawing Sheet

DIAMOND-BASED ELECTRICAL RESISTOR COMPONENT

RELATED APPLICATIONS

The present application is a U.S. National Phase PCT Application of PCT/EP03-04792, filed May 7, 2003, and claims priority from German Application No. 10220360.1, filed May 7, 2002, the disclosures of which are hereby incorporated by reference herein in their entireties.

FIELD OF THE INVENTION

The invention concerns a resistance in the form of an electrical circuit component, for example in the form of a terminator resistance for terminating electronic circuits or in the form of a load resistance for converting and conducting electrical energy into heat, in particular in the high-frequency area (HF), as well as a procedure for its production and utilization.

BACKGROUND OF THE INVENTION

For the practical application of resistant components in electronic circuits the common surface-mounted device (SMD) resistances in particular are known in terms of state-of-the-art, whereby a metal glaze layer is imprinted onto a high-purity, quadrate ceramic substrate serigraphically. Such SMD resistors are therefore encapsulated components that are mounted on the printed circuit board of an electronic circuit, e.g., by soldering.

Alternatively, the utilization of doped semi-conductors on the basis of aluminum nitride (AlN) to realize a resistance function is also known. Here, a thin, high-resistance, doped circuit path on an electrically insulating substrate is used.

Both methods of realizing resistances named here are subject to limitations, which restrict the scope of the component's utilization. For example, the stability of the resistance layer in the face of high temperatures is limited, as well as the ability to divert heat resulting from the resistance, meaning that the power such resistors can handle is relatively small. Another disadvantage of the aforementioned "semiconductor resistors", in addition to the large amount of space required, is the fact that the resistance value has a relatively large tolerance; in addition, the temperature dependence of such resistors is often an undesirable disadvantage.

The task of the invention at hand is to provide an electrical resistor component, in particular a cable termination resistor as well as a method of production thereof, whose resistance layers retain their integrity even at very high temperatures and at the same time feature a high level of heat conductivity, meaning that the resistor component meets the high demands placed on its load capacity and implements a high level of thermal power loss within a small area. The electrical features of the component are that it is non-temperature-sensitive in an area of high temperature.

SUMMARY OF THE INVENTION

In accordance with one aspect of the invention, an electrical component comprises a resistance area and contacts electrically connected to the resistance area; wherein the resistance area includes electrically conductive diamond.

Preferably, the component is in combination with a substrate and the resistance area is at least one layer on the substrate. The diamond in the resistance area is preferably p-doped or n-doped and the dopant includes at least one of the following materials: boron, sulfur, phosphoms, diamond-like carbon (DLC). lithium, hydrogen, nitrogen or $Sp^2$-bonded carbon. The concentration of the doping material of the diamond in the resistance area is substantially independent of temperature.

Preferably, the diamond in the resistance area is divided into areas having different dopant properties with various materials and/or varying strengths. The different dopant properties preferably include different dopant materials and/or different dopant concentrations.

Preferably, the substrate material is selected from diamond, highly oriented diamond (HOD), silicon, silicon nitride, silicon carbide, silicon oxide, silicon dioxide, silicon nitrides, iridium, refractory metals or carbides thereof, sapphire, magnesium oxide, graphite, germanium. niobium, tantalum, titanium, tungsten, tungsten carbide, titanium carbide and titanium nitride.

The substrate can be formed as one or more layers. If the substrate includes more than one layer, one of the layers preferably includes electrically insulating diamond and highly oriented diamond (HOD) that forms an interface with the resistance area.

A heat sink preferably interfaces with the substrate so the heat sink is in thermal contact with the substrate. The component is preferably in combination with an electrical insulator cover plate that contacts the component. The plate cover is preferably made of insulating diamond. The contacts are preferably plated on parts of the resistance area, and the plated contacts are selected from at least one of Ti, W, Pt, Au, TiW, WC, TiC, TiN, Si, Cu, Be, Fe, Al, Ni, refractory metals, Cr, Sn, Ba and alloys thereof. The contacts preferably include layers of the materials; the layers can be stacked. At least one of the contacts is connected to the resistance area.

The substrate can also be formed as a membrane having a rear surface preferably carrying a cooling system. The component preferably is in combination with a substrate on which the components are located in aligned relation. The contacts and resistance area can be coplanar. The component is preferably in combination with a conductor and is connected to the conductor as doped diamond.

Another aspect of the invention relates to a method of making a component including the step of growing a dopant on diamond in a diamond resistance area. The doped diamond is preferably Another aspect of the invention relates to a method of making a component including the step of growing a dopant on diamond in a diamond resistance area. The doped diamond is preferably grown by using at least one of CVD (Chemical Vapor Deposition), or MWPECVD (Microwave Plasma Enhanced CVD) or Hot Filament CVD or combination flame or other hydrogen methane plasma methods.

Different sub-areas of the resistance area are preferably separated by a cauterization process. A plurality of diamond resistance areas of different components are preferably simultaneously formed on the same substrate.

A further aspect of the invention concerns a composition of matter comprising diamond including a dopant agent, causing diamond to be p-doped so it is $p^+$ or $p^-$ doped. The dopant agent of the composition preferably includes at least one of boron, sulfur, phosphorus, diamond-like carbon (DLC), lithium, hydrogen, nitrogen or $Sp^2$-bonded carbon and preferably causes the composition of matter to have a resistivity between a mOhmcm and MOhmcm.

The fact that the resistance area is made of diamond, which is e.g., electrically conductive because of doping, means that a material is used for the resistance area of the resistor component which features an extraordinarily high heat conductivity of up to 2250 W/mK, amounting to a multiple of the values of silver and copper. Electrically conductive doping means that the diamond in the electrically insulated, nominally undoped form is made conductive in a defined way and in an area of specific resistivity values in an order of magnitude between a mOhmcm and MOhmcm. Here the diamond material can be monocrystalline on selected substrates (e.g., iridium) or polycrystalline.

As diamond not only features an enormously high thermal conductivity but also a low thermal capacity, typically 500 J/kgK, the resulting rapid response guarantees a reliable implementation even of large, short-term power outputs. The area required for implementing large power outputs is low as a result of the high realizable thermal power loss density (up to around 1.5 GW/cm$^3$) of diamond.

Also advantageous is the fact that diamond features an extremely low thermal coefficient of expansion meaning that a resistance area made of diamond can also be utilized in configurations that are sensitive to geometric forms and mechanical restraints. Another advantage is that the semiconductor bandgap of diamond of 5.4 to 5.5 eV is very high, whereby the formation of intrinsic charge carriers only occurs to the same extent as other materials with a lower bandgap at significantly higher temperatures. The almost constant charge carrier density resulting, over the whole temperature range between 0 and 500° C. contributes significantly to an almost constant resistance value of the resistor component.

The use of diamond as a form of resistance area is also advantageous because diamond is chemically inert and its surface is hydrophilically or hydrophobically adjustable, as well as being stable in the long-term, even under aggressive conditions. In terms of its utilization in circuits or other devices for practical application, diamond is advantageous as a resistance area particularly because of its abrasion resistance, its flexural strength of up to 1150 GPa and its breakage stress of 11 GPa, as a higher level of reliability is guaranteed, even under conditions of mechanical strain such as tensions from the spread of temperature around the housing.

Another advantage: The use of diamond material in the invention at hand does not only enable the almost constant resistance value of the resistor component within a temperature range of 0 to 500° C., but also guarantees the thermal stability of the resistance layer up to a temperature of 600° C. Due to the small dielectric loss angle tan $d_e$ that is negligible for all applications considered here, only a very small level of parasitic power loss occurs. The doped diamond (p$^+$or p$^-$) is therefore also suitable as a supply line to the resistor component.

The resistor component in accordance with the invention is therefore able to be utilized in a broad spectrum of ways, particularly in high frequency technology as well as in a variety of various forms such as a resistance element in the form of an electrically conductive doped diamond layer in itself and/or in coplanar configurations. The resistance element can also be used as an attenuation pad.

The electric resistor component can be implemented advantageously in planar technology so that the resistance area is made out of electrically conductive, doped diamond that is imprinted as a layer on a substrate. In this way heat loss to the environment or adjacent layers is guaranteed; traditional methods of micro-technology and microelectronics can be adapted to the production of components in layer technology.

The utilization of non-conductive diamond and/or highly-oriented, non-conductive diamond (HOD) as a substrate is particularly advantageous. In this way a very good electrical insulator is used, which is highly insulating even in the high frequency area and has almost identical material qualities to the resistance area made of electrically conductive doped diamond. Particularly important here are the thermal qualities, but also the mechanical qualities such as the elasticity of the material, as previously detailed.

Alternatively to the substrate made of non-conductive diamond, another substrate or another substrate with a layer of non-conductive diamond or HOD can be used, whereby the substrate material is advantageously selected from the materials silicon, silicon nitride, silicon carbide, silicon oxide, silicon dioxide, iridium, glass, refractory metals or carbides from glass, sapphire, magnesium oxide, graphite, germanium, niobium, tantalum, titanium, tungsten, tungsten carbide, titanium carbide and titanium nitride. The insulating quality of the non-conductive diamond layer comes into its own when it is immediately adjacent to the resistance area made out of electrically conductive doped diamond. The substrate itself can also be formed as a layer.

In each case the quality of heat conductivity of the non-conductive diamond in the substrate can therefore be advantageously exploited so that the electrical resistor component is equipped with a heat sink, which is adjacent to the substrate and in which the heat transferred by the diamond or by the substrate is dissipated. The substrate can be formed as a membrane, which is brought directly into contact with a coolant. The high level of heat conductivity of diamond means that it represents the most effective way of dissipating heat generated by the component.

The diamond resistance area of the component is either p$^-$doped or n$^-$doped. Doping can take place by using at least one of the materials boron, sulfur, phosphorus, graphite, diamond, diamond-like carbon (DLC), lithium, hydrogen, nitrogen or Sp$^2$-bonded carbon. A very strong doping, p = $10^{19}$ cm$^{-3}$, of the diamond resistance area, e.g., with boron, brings with it the advantage that the electrical resistance of the resistance area is almost independent of temperature, causing the effective activation energy of the material forming the resistance to be practically evanescently low.

If the resistance area is doped in different sub-areas with different materials and/or different strengths, the qualities of the resistor component can be selectively formed for a broad range of applications. For example, the resistance value can be made dependent on environmental influences such as the pH value of surroundings.

Selective setting of the concentration of the dopant material means that the dependence of the resistor on heat can be controlled still further.

Another advantage of the invention at hand is that the component geometry can be regulated. Here, e.g., the trim plating for determining the length of the resistor component, and therefore the resistance value, can be varied. In addition, the doping can be fixed and the length varies or the fixed resistance value can be determined via a variable doping with a fixed length.

Plating of the resistance area is designed to provide contacts. The contacts can also be placed on the rear side. The materials used for the plating are preferably pre-selected: Ti, W, Pt, Au, TiW, WC, TiC, TiN, Si, Cu, Be, Fe, Al, Ni, refractory metals, Cr, Sn and/or Ba, or layers of these metals and/or respective alloys aligned on top of one another.

A preferable method of operating the invention also envisages aligning several, two to ten, individual components in stacked relation on a substrate, thereby increasing the application of the component of the invention at hand significantly.

It has also been shown that the advantages of the component of the invention at hand take effect in particular if it is formed as a power termination resistor. This is particularly suited to high-frequency technology with a wave impedance level of about 50-75 O.

Because the diamond of the resistance area is grown on a substrate for the production of the resistor component and during this growth process the doping material is already integrated into the diamond of the resistance area, a sub-area of an entire diamond structure made from electrically conductive, doped diamond layers and non-conductive diamond layers is represented with technical simplicity and without delaying any contact steps. Such a process can, for example, take place by using CVD (Chemical Vapor Deposition), or MWPECVD (Microwave Plasma Enhanced CVD) or by using Hot Filament CVD or combustion flame or other hydrogen methane plasma methods.

An advantage of the invention envisages providing the diamond resistance area with metal plating for the disposing of electrical voltage. Contacts can also be applied from the rear side.

Because the various areas of the resistance area from one another, are doped with different materials and/or to different degrees during the production process, there is a reduction in the technical complexity to envisage a cauterization process or a step with selective growth in the production process.

The invention will be described in the following on the basis of concrete operational examples and several sketches.

BRIEF DESCRIPTION OF THE DRAWING

The following show.

DETAILED DESCRIPTION OF THE INVENTION

Figure 1:
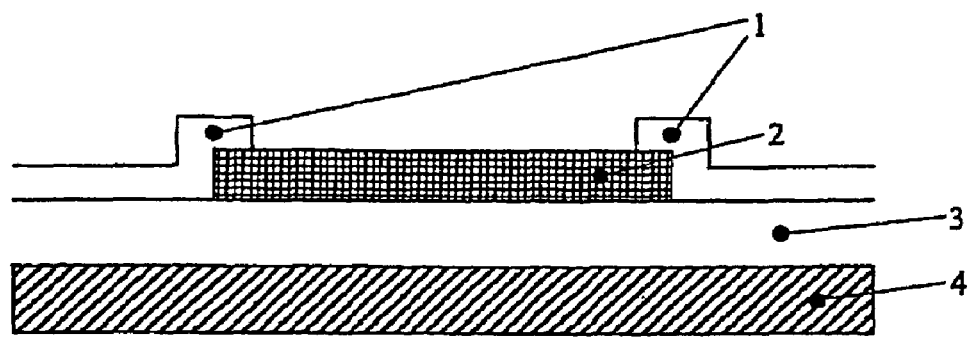
FIG. 1 A cross-sectional view of a resistor component in layer technology and with a heat sink.
Figure 2:
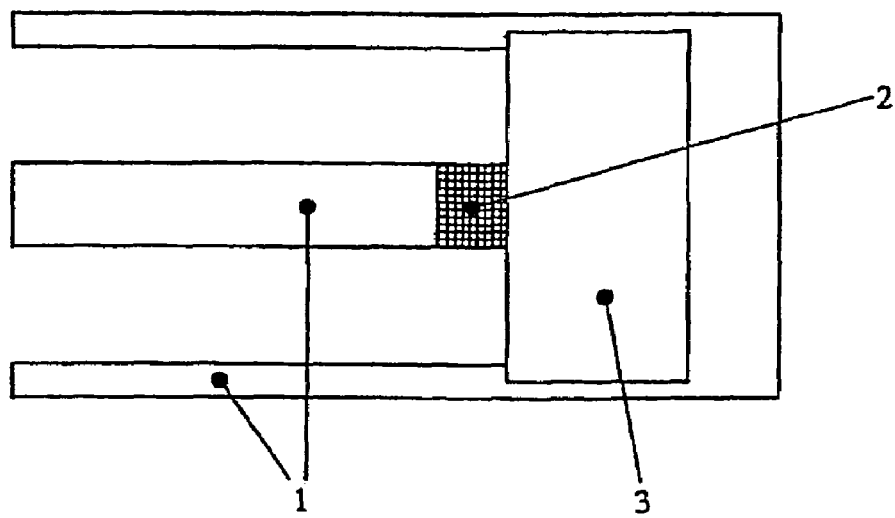
FIG. 2 A plan view of a resistor component as designed in coplanar technology and applied to HF technology.

FIG. 1 shows a resistor component that is formed in layer technology (planar technology), in cross-section. Tension is placed on the resistance area 2 by contacts 1, e.g., made from metal. The resistance area 2 is formed as a resistance layer on substrate 3. While the resistance layer 2 is made out of electrically conductive doped diamond—in this case a $p^+$doped with boron where the concentration of the dopant is greater than $5 \times 10^{17}$ cm$^{-3}$ —the substrate is made from non-conductive diamond, whereby other substrate materials can be used. But in terms of material qualities, the use of non-conductive material as a substrate or at least as a resistance layer or resistance area adjacent to the substrate layer seems particularly suited, as diamonds are a good electric insulator with simultaneous excellent heat conductivity and low heat capacity.

The contacts 1 here can be formed as metal plating, whereby this plating can be selected from Ti, W, Pt, Au, TiW, WC, TiC, TiN, Si, Cu, Be, Fe, Al, Ni, refractory metals, Cr, Sn, and/or Ba or layers of these metals or alloys of these metals aligned on top of one another.

The substrate 3 made of non-conductive diamond is adjacent to a heat sink 4, which is made of silicon, aluminum or water and dissipates the heat that accumulates. The power applied via the contact 1 and transferred to heat in the resistance area 2 is transmitted rapidly and spatially evenly via the resistance area above to the substrate layer 3. The area that is needed for the resistance area 2 to transform electric current into heat is small because of the high level of stability of the electrically conductive doped diamond material of <1.5 GW/cm$^3$.

The substrate layer 3 made of electrically non-conductive diamond acts as a strong electrical insulator, but nevertheless provides good transfer of the heat that accumulates in the resistance area 2 to the adjacent heat sink 4.

In this example the resistor component is produced by the diamond layer being grown on a substrate by using CVD (Chemical Vapor Deposition) and the doping of the diamond of the resistance layer 2 already having taken place during this growth process. It is possible here to use the heat sink 4 as this substrate material, for example from silicon, and to grow the substrate layer 3 of electrically non-conductive diamond on this heat sink, and in turn to grow the resistance layer 2 on this substrate layer with involvement of an electrically conductive dopant, which can be doped in various different areas with varying strength or with varying materials and is envisaged with plating or contacts 1. Areas of the resistance layer 2 can also be separated from one another by using a cauterization process.

The plan view serves to visualize a resistor component as it can be aligned within the scope of an electronic circuit. The resistance area 2 is electrically connected with the contacts and the supply lines 1, substrate and heat sink are not illustrated in any more detail and form marginal and therefore hidden layers analogous to the cross-section in FIG. 1.

The plan view of a resistor component serves to visualize how it can be used in high-frequency technology. The resistance area 2 is therefore affixed with so-called coplanar technology on one level to the electrical power supplies 1 on a substrate. The power supply here is formed in three parts. In the middle is the so-called signal conductor, surrounded by two so-called mass conductors. Not shown here are the substrate layers and heat sink analog to FIG. 1. A symmetrical wave path for electromagnetic waves is guaranteed with this alignment. Diamond has the advantage that its relative dielectric figure $e_r$=5.7 to $e_r$=5.8 differs much less from the relative dielectric constants of air ($e_r$=5.7) than would be the case with other materials. A better path for electrical power waves in this conductor alignment is guaranteed in this way. The use of an undoped diamond as a substrate for the structure is also advantageous in that the dielectric insulation is lower than with materials that are customarily used, because the nominally undoped diamond is an extremely good insulator, with values of 0.025 to 0.03 dB/mm @ 20 GHz (conductor geometry, conductor density 2 μm gold, diamond layer density: 30 μm membrane, slot width: 20 μm, mass-mass displacement: 200 μm).

The adjustment of the entire structure to wave impedances of 50 Ohms or 75 Ohms as customary in high-frequency technology is therefore considerably alleviated.

Adjustment via a broad area of temperature is guaranteed because the resistance material conductivity is largely independent of temperature. A functionally equivalent design would also be in micro-strip conduction technology or other conduction structures used in high-frequency technology.

The invention claimed is:
1. A method of making an electrical component having a resistance area and contacts electrically connected to the resistance area, the resistance area including electrically conductive diamond, the diamond in the resistance area being prepared or n-doped and divided into areas having different dopant properties with various materials and/or varying strengths, the method comprising:
   growing a dopant on diamond in the diamond resistance area;
   forming different diamond doped sub-areas in the resistance area, the different doped areas being doped with at least one of different materials and different concentrations; and separating the different sub-areas by a cauterization process.

2. A method in accordance with claim 1, wherein the doped diamond is grown by using at least one of CVD (Chemical Vapor Deposition), or MWPECVD (Microwave Plasma Enhanced CVD) or Hot Filament CVD or combustion flame or other hydrogen methane plasma methods.

3. The method of claim 1, further including plating the contacts on the resistance area.

4. The method of claim 1, wherein a plurality of diamond resistance areas of different components are simultaneously formed on the same substrate.

5. The method of claim 1, wherein the diamond includes a dopant agent.

6. The method of claim 5, wherein the dopant agent causes the diamond to be p-doped.

7. The method of claim 5, wherein the dopant agent causes the diamond to be $p^+$.

8. The method of claim 5, wherein the dopant agent causes the diamond to be $p^-$.

9. The method according to claim 5, wherein the dopant agent includes at least one of boron, sulfur, phosphorus, diamond-like carbon (DLC), lithium, hydrogen, nitrogen or $Sp^2$-bonded carbon.

10. The method according to claim 5, wherein the dopant agent causes the composition of matter to have a resistivity between a mOhmcm and MOhmcm.

11. The method of claim 1 wherein the component is in combination with a substrate, the resistance area being at least one layer on the substrate.

12. The method of claim 11, wherein the substrate material is selected from diamond, highly-oriented diamond (HOD), silicon, silicon nitride, silicon carbide, silicon oxide, silicon dioxide, silicon nitrides, iridium, refractory metals or carbides thereof, sapphire, magnesium oxide, graphite, germanium, niobium, tantalum, titanium, tungsten, tungsten carbide, titanium carbide and titanium nitride.

13. The method of claim 11, wherein the substrate is formed as a layer.

14. The method of claim 11, wherein the substrate includes at least two layers, one of the layers including electrically insulating diamond and highly oriented diamond (HOD), forming an interface with the resistance area.

15. The method of claim 1, wherein the different dopant properties include different dopant materials.

16. The method of claim 15, wherein the different dopant properties include different dopant concentrations.

17. The method of claim 15, wherein the different dopant properties include different dopant materials and concentrations.

18. The method of claim 1, wherein the dopant includes at least one of the following materials: boron, sulfur, phosphorus, diamond-like carbon (DLC), lithium, hydrogen, nitrogen or $Sp^2$-bonded carbon.

19. The method of claim 1, wherein the concentration of the doping material of the diamond in the resistance area is so great that the electrical resistance of the diamond in the resistance area is substantially independent of temperature.

20. The method of claim 1, wherein the contacts are plated on parts of the resistance area, the plated contacts being selected from at least one of Ti, W, Pt, Au, TiW, WO, TiC, TiN, Si, Cu, Be, Fe, Al, Ni, refractory metals, Cr, Sn, Ba and alloys thereof.

21. The method of claim 20, wherein the contacts include layers of the materials.

22. The method of claim 21, wherein the layers are stacked.

23. The method of claim 20, wherein at least one of the contacts is connected to the resistance area.

24. The method of claim 1 wherein a plurality of the components are in combination with a substrate on which the components are located in aligned relation.

25. The method of claim 1, wherein the contacts and resistance area are coplanar.

26. The method of claim 1, wherein the component is in combination with a conductor and is connected to the conductor as doped diamond.

* * * * *